United States Patent
Adsitt

(10) Patent No.: US 7,596,729 B2
(45) Date of Patent: Sep. 29, 2009

(54) MEMORY DEVICE TESTING SYSTEM AND METHOD USING COMPRESSED FAIL DATA

(75) Inventor: Matthew L. Adsitt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 433 days.

(21) Appl. No.: 11/479,848

(22) Filed: Jun. 30, 2006

(65) Prior Publication Data

US 2008/0005630 A1    Jan. 3, 2008

(51) Int. Cl.
*G11C 29/00* (2006.01)

(52) U.S. Cl. ............... 714/723; 714/5; 714/42; 714/718; 714/719; 714/724; 714/738; 365/201

(58) Field of Classification Search .................. None
See application file for complete search history.

(56) References Cited

U.S. PATENT DOCUMENTS

| | | | | |
|---|---|---|---|---|
| 5,442,641 A | * | 8/1995 | Beranger et al. ............. | 714/719 |
| 5,579,272 A | | 11/1996 | Uchida ........................ | 365/201 |
| 5,689,255 A | * | 11/1997 | Frazier et al. ................. | 341/63 |
| 5,777,933 A | | 7/1998 | Horihata et al. ............. | 365/201 |
| 5,809,038 A | | 9/1998 | Martin ....................... | 371/21.2 |
| 5,864,510 A | | 1/1999 | Nakaoka ..................... | 365/201 |
| 5,926,422 A | | 7/1999 | Haukness .................... | 365/201 |
| 5,935,263 A | | 8/1999 | Keeth et al. ................. | 714/718 |
| 6,032,274 A | | 2/2000 | Manning .................... | 714/718 |
| 6,055,654 A | | 4/2000 | Martin ........................ | 714/719 |
| 6,058,056 A | * | 5/2000 | Beffa et al. ................. | 365/201 |
| 6,163,863 A | | 12/2000 | Schicht ........................ | 714/718 |
| 6,202,179 B1 | | 3/2001 | Morzano ..................... | 714/710 |
| 6,208,273 B1 | * | 3/2001 | Dye et al. ..................... | 341/51 |
| 6,226,765 B1 | | 5/2001 | Le et al. ..................... | 714/718 |
| 6,269,455 B1 | * | 7/2001 | Deas ........................... | 714/29 |
| 6,301,169 B1 | | 10/2001 | Kikuda et al. ............... | 365/201 |
| 6,311,299 B1 | | 10/2001 | Bunker ....................... | 714/719 |
| 6,360,340 B1 | * | 3/2002 | Brown et al. ................. | 714/718 |
| 6,374,378 B1 | * | 4/2002 | Takano et al. ............... | 714/719 |
| 6,543,015 B1 | | 4/2003 | Wang et al. ................. | 714/718 |
| 6,643,805 B1 | | 11/2003 | Kikutake et al. ............ | 714/718 |
| 6,667,919 B1 | | 12/2003 | Ma et al. ..................... | 365/201 |
| 6,721,911 B1 | * | 4/2004 | Marinissen et al. ......... | 714/718 |
| 6,731,553 B2 | | 5/2004 | Fujioka et al. ............. | 365/201 |
| 6,735,729 B1 | | 5/2004 | Merritt et al. ............... | 714/718 |
| 6,906,645 B2 | * | 6/2005 | Jones et al. .................. | 341/51 |
| 6,930,936 B2 | | 8/2005 | Santin ........................ | 365/201 |

(Continued)

*Primary Examiner*—John P Trimmings
(74) *Attorney, Agent, or Firm*—Dorsey & Whitney LLP

(57) ABSTRACT

A memory device testing system includes a signal generator providing memory command, address and write data signal to write data in a memory device and then read the data from the memory device. Each item of read data is compared to the corresponding item of write data, and fail data is produced indicative of the results of the comparison. The fail data is compressed using a lossless compression scheme so that a record of the fail data can be transferred to a host in real time. The compressed fail data may be a literal record that specifies the value of consecutively repeating fail data as well as the number of times the fail data repeats. The fail data may also be a record specifying the literal records in a repeating sequence of literal records as well as the number of times the sequence repeats.

25 Claims, 9 Drawing Sheets

U.S. PATENT DOCUMENTS

| | | |
|---|---|---|
| 6,950,971 B2 | 9/2005 | Boehler et al. ............... 714/710 |
| 6,976,195 B1 | 12/2005 | Seyyedy et al. ............. 714/718 |
| RE38,956 E | 1/2006 | Beffa et al. .................. 365/201 |
| 7,046,563 B1 | 5/2006 | Kim ........................... 365/201 |
| 7,113,435 B2 | 9/2006 | Santin ......................... 365/201 |
| 7,123,542 B2 | 10/2006 | Fekih-Romdhane et al. .......................... 365/236 |
| 7,143,327 B2 * | 11/2006 | Barone ....................... 714/738 |
| 2002/0118580 A1 | 8/2002 | Santin ......................... 365/200 |
| 2003/0088815 A1 | 5/2003 | Boehler et al. ............... 714/710 |
| 2003/0099143 A1 | 5/2003 | Fujioka et al. ............... 365/201 |
| 2003/0233604 A1 * | 12/2003 | Lin et al. ..................... 714/718 |
| 2004/0153599 A1 | 8/2004 | Naso .......................... 711/100 |
| 2004/0177295 A1 | 9/2004 | Barone ....................... 714/724 |
| 2005/0213397 A1 | 9/2005 | Santin .................... 365/189.05 |
| 2006/0044880 A1 | 3/2006 | Naso ..................... 365/189.05 |
| 2006/0090108 A1 | 4/2006 | Seyyedy et al. ............. 714/718 |
| 2006/0095823 A1 * | 5/2006 | Fujiwara ..................... 714/738 |
| 2006/0123291 A1 | 6/2006 | Kim ........................... 714/724 |
| 2006/0179377 A1 * | 8/2006 | Dawson et al. .............. 714/733 |
| 2006/0215470 A1 | 9/2006 | Santin ......................... 365/201 |
| 2006/0221736 A1 | 10/2006 | Santin ......................... 365/201 |
| 2006/0221737 A1 | 10/2006 | Santin ......................... 365/201 |

* cited by examiner

MEMORY DEVICE TESTING SYSTEM AND METHOD USING COMPRESSED FAIL DATA

TECHNICAL FIELD

The present invention relates generally to the testing of semiconductor memories, and more specifically to a method and circuit for performing compression to reduce the time for testing memory cells in a semiconductor memory.

BACKGROUND OF THE INVENTION

During the manufacture of semiconductor memory devices, it is necessary to test each memory to ensure it is operating properly. Electronic and computer systems containing semiconductor memories also normally test the memories when power is initially applied to the system. A typical memory device includes a number of arrays, each array including a number of memory cells arranged in rows and columns. During testing of the memory devices, each memory cell must be tested to ensure it is operating properly. In a typical prior art test method, data having a first binary value (e.g., a "1") is written to and read from all memory cells in the arrays, and thereafter data having a different binary value (e.g., a "0") is typically written to and read from the memory cells. A memory cell is determined to be defective when the data written to the memory cell does not equal that read from the memory cell. As understood by one skilled in the art, other test data patterns may be utilized in testing the memory cells, such as an alternating bit pattern "101010 . . . 0" written to the memory cells in each row of the arrays.

In a typical test configuration, an automated memory tester is coupled to address, data, and control buses of the memory device, and applies signals to these buses to perform the desired tests. As the storage capacity of memory devices increase, the number of memory cells and hence the number of data transfer operations the tester must perform correspondingly increases. For example, in a memory array having n rows and m columns of memory cells, the tester performs n*m cell accesses in writing the first binary data values to all the memory cells in the array, and thereafter performs n*m cell accesses in reading the same data. The tester must once again perform n*m accesses in writing data having a second binary value to each memory cell, and the same number of accesses in reading this data. The tester thus performs a total of four times n*m cell accesses, each of which requires a bus cycle to perform.

Data compression has been used by some testers to reduce the number of bus cycles required to test memory cells. Data compression generally relies on some means of quickly writing data to the memory cells of the memory device, and then reducing the amount of data that must be read from the memory device to indicate a pass or a fail condition. For example, sense amplifiers of an SDRAM device may be held at a particular logic level, such as a level corresponding to a binary "1" value, and the rows of memory cells sequentially activated, thereby quickly writing a binary value of "1" to each of the memory cells in the array. When data is read from the memory device, the binary values from all of the memory cells or groups of memory cells can be applied to an AND gate or other logic circuit. The logic circuit outputs a logic "1" if all of the memory cells in the row properly functioned to store the correct binary value. A similar process can then be used to write a binary value of "0" to all of the memory cells and then read the values stored in the memory cells. The results of reading each row can then be combined by conventional means so that the memory device will output a single binary value indicating either a pass or a fail condition.

Although compressed data testing of memory devices as described above can quickly provide a tester with an indication of whether or not all memory cells are functioning properly, it does not allow the tester to determine if multiple memory cells are malfunctioning or to identify the locations of one or more memory cell failures. Yet knowing the number and location of memory cell failures can provide valuable information during production testing since such information can be used to correct processing deficiencies. To provide complete testing information, the tester must read data from every memory cell in the memory device. The data read from each memory cell are then compared to the data written to that same memory cells, and any discrepancy is recorded as an error for that cell. The error data are then stored in a high-speed memory, known as an Error Catch RAM ("ECR"). Once the data from the memory device have been captured by the ECR, an error map identifying the failed memory cells is created.

Two approaches have conventionally been used to implement an ECR. One approach is to use an expensive high-speed static random access memory ("SRAM") device, which is capable of capturing the read data from the memory device at the required operating speed. The other approach is to use interleaved banks of DRAM to capture the read data. Interleaving pages of DRAM can be less expensive than using a high-speed SDRAM device, but poses additional complications in reconstructing the read data. The difficulty in using either of these approaches is exacerbated by memory devices having significantly greater storage capacities, such as state-of-the-art NAND Flash memory devices. As a result, conventional testers must separately test different portions of such high-capacity memory devices, which requires a significant amount of time to complete a test.

There is therefore a need for a compression system and the method that can be used by memory testers to provide an error map of the memory device being tested that can function at the normal operating speed of memory devices and that does not require a very large data storage device.

SUMMARY OF THE INVENTION

A memory device testing system includes a signal generator that generates memory device command, address and write data signals. The signal generator initially outputs sets of memory write command signals, address signals and write data signals, which may be coupled to a memory device being tested. After a plurality of sets of write data have been stored in the memory device, the signal generator outputs sets of memory read command signals and address signals to cause the memory device to provide read data signals to the testing system. The testing system also includes a comparator that receives each set of read data signals and compare them to a corresponding set of the write data signals. The comparator outputs a fail data signal having a first value responsive to each of the received set of read data signals matching the corresponding set of write data signals. If each of the received set of read data signals does not match the corresponding set of write data signals, the comparator outputs a fail data signal having a second value. A fail data compressor in the testing system generates from the fail data signals compressed fail data corresponding to the sets of addresses signals at which respective sets of read data signals do not match corresponding sets of write data signals. The fail data provided by the fail data compressor may include records of a first type indicating the number of consecutive sets of address signals for which respective fail data signals have the same value. The fail data provided by the fail data compressor may include records of a second type indicating the number of times that a sequence of records of the first type is repeated.

DETAILED DESCRIPTION OF THE INVENTION

Figure 1:
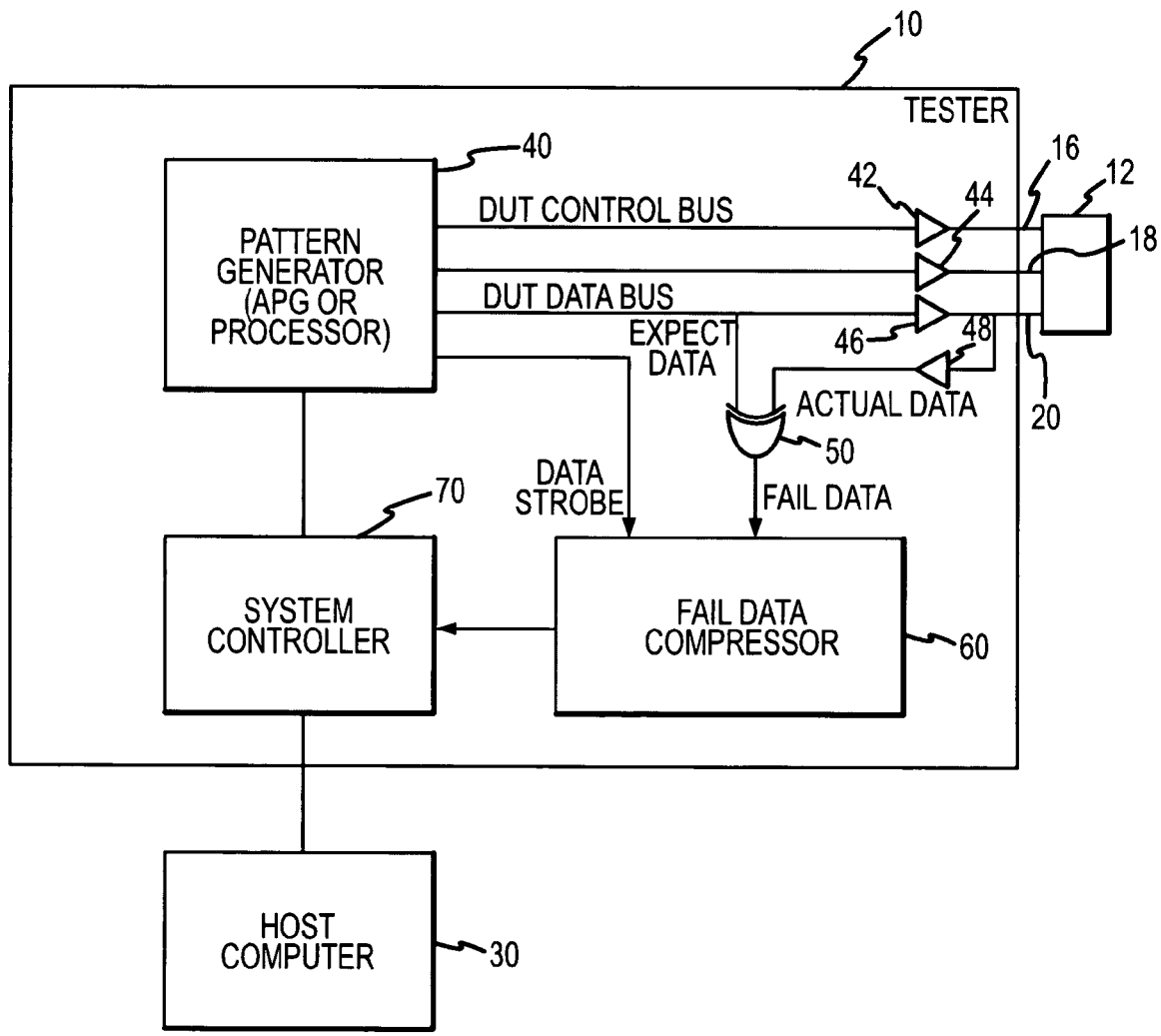
FIG. 1 is a block diagram illustrating a test system according to one example of the invention.

A test system 10 according to one example of the present invention is illustrated in FIG. 1. The test system 10 is connected to a memory device 12 through a control bus 16, an address bus 18 and a data bus 20. The memory device 12 may be any conventional or hereinafter developed memory device, including a dynamic random access memory ("DRAM") device, a static random access memory ("SRAM") device, read only memory ("ROM") device, a flash memory device or some other type of memory device. Also, the memory device 12 may be connected to the tester 10 through other than the control bus 16, address bus 18 and data bus 20. For example, a combined command/address bus may be used instead of a separate control bus 16 and address bus 18, or, in even the memory device 12 is a packetized memory device, a single communication path, which may be optical, may be used to couple signals to and from the memory device 12. Other variations will be apparent to one skill in the art or may be developed in the future. The tester 10 may also be connected to a host computer 30 programmed to receive test results and output information inappropriate formats, such as test reports.

The tester 10 includes a pattern generator 40 that provides a pattern of control, address and write data signals to the memory device 12 through respective drivers 42, 44, 46 and the command bus 16, addresses bus 18 and data bus 20, respectively. The number of bits in the control, address and write data signals will generally correspond to the width of the command bus 16, address bus 18 and data bus 20, respectively. The pattern of signals are such that predetermined write data are stored in the memory device 12. The write data may be, for example, data bits having a single value, i.e., all "0" or all "1," a predetermined data pattern, such as alternating "0" and "1" or some other pattern.

After a desired amount of data have been written to the memory device 12, the pattern generator applies appropriate command and address signals to the memory device 12 to read data from the memory device 12. If the memory device is operating properly, the pattern of read data will be identical to the pattern of write data. The read data signals from the memory device 12 are coupled through a driver and 48 to one input of an exclusive OR-gate 50. Although only a single exclusive OR-gate 50 is showing FIG. 1, it will be understood that an exclusive OR-gate is provided for each bit of data coupled from the memory device 12. As data signals are coupled to the exclusive OR-gate 50 from each addressed location in the memory device 12, the write data signals written to the addressed location are output from the pattern generator 40 and apply to the other input of the exclusive OR-gate 50. The exclusive OR-gate 50 compares the read data to the corresponding write data and outputs a predetermined logic level, such as a logic "1," in the events the read data does not match the write data. This predetermined logic level bus indicates a failure at the addressed memory location.

The fail data bit from the exclusive OR-gate 50 is applied to a fail data compressor 60, which also receives a Data Strobe signal from the pattern generator 40. The Data Strobe signal is synchronized with read commands from the pattern generator 40 and is used to capture the fail data signal in the Fail Data Compressor 60. The fail data applied to the Fail Data Compressor 60 comprises a bit pattern corresponding to a fail pattern of the memory device 12. In other words, the actual pattern of data written to or read from the memory device 12 is not recorded. The Fail Data Compressor 60 operates on each incoming word of Fail Data and translates these into a sequence of "Events". There are three district types of Events: The RunLength Event generated by a Run Length Compressor (not shown in FIG. 1), a Sequence Event generated by a Sequence Compressor (not shown in FIG. 1), and a New Literal Event generated by a Literal Generator (not shown in FIG. 1), all of which will be explained below.

The sequence of Events is then compressed, serialized and divided into 32-bit words which are buffered and passed to a system controller 70, which uploads it to the host computer 30.

Figure 2:
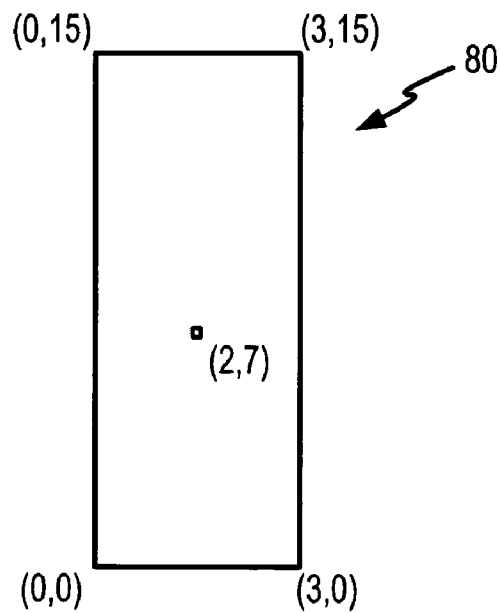
FIG. 2 is a block diagram showing one example of a memory array having a memory cell failure that can be reported using with compressed data using the testing system of FIG. 1.

As explained above, if the Fail Data output from the exclusive OR-gate 50 was simply written to an error capture RAM, it would be necessary for the RAM to be very large and operate at a very high speed. Instead, the Fail Data are compressed using a lossless compression scheme. The manner in which this compression is accomplished is explained with reference to FIGS. 2 and 3. With reference first, to FIG. 2, a 4×16 bit memory array 80 having a data bit width is shown. It is assumed that all of the locations in the array 80 are functioning properly except for the memory location in column 2, row 7. The fail pattern from the memory array 80 will therefore consist of a single "1" in location (2,7) and 63 "0s" in the remaining locations. Although a failure in a single memory location may be relatively uncommon, it is also uncommon for there to be failures in a large number of memory locations.

Insofar as most of the memory locations in the memory array 80 are operable, there is no need to provide information about all of the memory cells in the array 80 to provide a complete description of the arrays faulty memory cells. In fact, in examining the memory cells from the first location (0,0) to the last location (3,15), there are only really three "events" needed to describe the operability of the array 80. The first event is all of the memory cells in the array 80 leading up to the failed memory cell, the second event is the failed memory cell at (2,7), and the third event is all of the memory cells following the failed memory cell. Considering the fail data pattern in the array 80, the first location (0,0) is a logic "0," and it is repeated 38 times before reaching the failed memory cell at (2,7). Therefore, the first event can be represented by the terminology "RLIT 0, 38," where the term "RLIT" designates a "repeated literal," the "0" represents the value of the fail data in the first event, and the "38" represents the number of times that fail data has been repeated. Similarly, the failed memory cell at (2, 7) can be represented by the terminology "RLIT 1,0" since the fail data bit is "1" for the failed memory cell and it is repeated 0 times. Finally, the third event can be represented by the terminology "RLIT 0,23" since the fail data bit is "0" for the next memory cell, and that data bit is repeated 23 times for the remaining memory cells. The total number of memory cells in a 4×16 array is 64, which must be equal to the sum of the number of events (i.e., 3) and the number of times each event repeats (i.e., 3+38+0+23), which equals 64. The reduction in data using this compression algorithm is readily apparent, and would be dramatically greater for a much larger memory array having relatively few defective memory cells.

Figure 3:
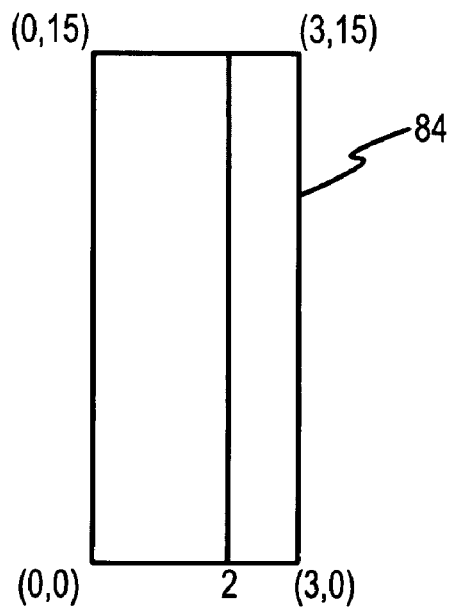
FIG. 3 is a block diagram showing another example of a memory array having a memory cell failure that can be reported using with compressed data using the testing system of FIG. 1.

Although the algorithm explained above with reference to FIG. 2 provide significant data compression, the data compression can be further increased. With reference to FIG. 3, a memory array 84 has a defective third column so that a failed memory cell is present in every row. The repeated literal events for this memory array 84 using the same compression algorithm as before are as follows:

| Event | Descriptor | Array Locations |
|---|---|---|
| 0 | RLIT 0,1 | (0,0) to (1,0) |
| 1 | RLIT 1,0 | (2,0) |
| 2 | RLIT 0,2 | (3,0) to (1,1) |

-continued

| Event | Descriptor | Array Locations |
|---|---|---|
| 3 | RLIT 1,0 | (2,1) |
| 4 | RLIT 0,2 | (3,1) to (1,2) |
| 5 | RLIT 1,0 | (2,2) |
| 6 | RLIT 0,2 | (3,2) to (1,3) |
| | * * * | |
| 32 | RLIT 1,0 | (2,15) |
| 33 | RLIT 0,0 | (3,15) |

Using this algorithm, it would be necessary to describe 33 events. However, it can be seen from the above listing of repeated literals that the sequence RLIT 1,0 followed by RLIT 0,2 is repeated. Therefore, the above listing of repeated literals can be represented by the terminology

| Event | Descriptor | Array Locations |
|---|---|---|
| 0 | RLIT 0,1 | (0,0) to (1,0) |
| 1 | RLIT 1,0 | (2,0) |
| 2 | RLIT 0,2 | (3,0) to (1,1) |
| 3 | RSEQ 2,14 | (2,0) to (1,15) |
| 4 | RLIT 1,0 | (2,15) |
| 5 | RLIT 1,0 | (3,15) |

In this compression algorithm, the term "RSEQ" designates a "repeated sequence," the "2" represents the number of previous repeated literals that are in the sequence, and the "14" represents the number of times the sequence has been repeated. Using this algorithm, the 33 events required using the prior algorithm had been reduced to 5 events. Again, the number of memory cells in the array 84 can be calculated using the formula" Cells=#RLIT+Sum #RLIT Repeats+for each RSEQ (#RLIT in SEQ+Sum #RLIT Repeats in SEQ) *RSEQ Repeats. For the above example, the number of Cells is: 64=5+3+(2+2)*14

It should also be noted that the compression algorithm explained with reference to FIG. 3 can be further compressed by providing a designator indicative of the repeat pattern of a sequence.

The algorithm explained above with reference to FIG. 3 can be generalized further as follows:

| Ecode | NibCnt | Index | RptCnt |
|---|---|---|---|
| NLIT = 00 | | | |
| RSEQ = 01 | Number of | The LitCAM index | The number of times |
| RLIT = 10 | Nibbles in | where the fail | the event is repeated |
| XLIT = 11 | RptCnt | data is stored | |

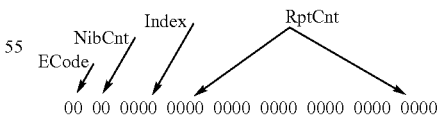

00 00 0000 0000 0000 0000 0000 0000 0000

The two ECode bits designate one of four possible event codes, which include the previously discussed repeated literal "RLIT" and repeated sequence "RSEQ." Also included and discussed below are extended literal "XLIT" and new literal "NLIT" event codes. The four Index bits represent the micro-bit address provided by the LitCAM of the RLIT and XLIT events described above. For an RSEQ event, the index designates the "depth" of the repeated sequence, i.e., the number of RLIT events in the sequence, which may have a length of up to 15 (i.e., $2^4-1$) RLIT events. The two-bit nibble count ("NibCnt") designates the number of nibbles in the repeat count ("RptCnt"), which, for both the previously described RLIT and RSEQ events, designates the number of times the event is repeated. Insofar as the NibCnt consists of two bits, the RptCnt field may consist of up to 3 nibbles. However, insofar as an RLIT event may repeat for more than $2^{12}$ times, the number of nibbles in the RptCnt may be extended using the extended literal XLIT event. Specifically, the two NibCnt bits designate 0 to 3 nibbles for an RSEQ event and an RLIT event, but 4-7 nibbles for an XLIT event.

As mentioned above, the new literal NLIT event may be used to specify more than 4 bits of data stored at each address in the array for a repeated literal RLIT event. The NLIT event is used in connection with a relatively small table which stores data patterns having a width corresponding to the width of the memory array being tested. This table, which may be considered a "dictionary," is preferably preloaded with the most frequent fail patterns, such as all fails, no fails and single bit fails. When an RLIT or XLIT event needs to describe a literal fail pattern, the testing system examines the entries in the dictionary for a match. If a match is found, the address of the matching fail data is used rather than the 16-bit literal fail data. Insofar as the dictionary is only 16 entries along, the 4 index bits are sufficient to designate each of the entries in the table.

In the event the fail data pattern is not found in the dictionary, one of the entries in the dictionary is replaced with the current fail data pattern, and the address of the replaced entry is stored in the index field. However, it is necessary for the host computer 30 (FIG. 1) to be able to reconstruct all of the fail data patterns, including those that have been replaced in the dictionary. For this purpose, the new literal NLIT event is used. The NLIT event allows the host computer to record that a new literal has been added to the dictionary at a specific address. When the host computer 30 decompresses the fail data, its dictionary is initialized to the fail data patterns in the dictionary that are identical to the fail data pattern initially stored in the dictionary of the test system. When the decompresser in the host computer 30 detects an NLIT event, it updates its dictionary accordingly. As long as the dictionary in the test system 10 replaces entries in a known order, the dictionary in the host computer 30 replaces entries in the same order. Therefore, the dictionary in the host computer 30 maintains coherency with the dictionary in the test system 10.

For a memory device 12 having an array 16 bits wide, the NLIT event would require 18 bits, i.e., 2 bits for the ECode and 16 bits for the literal fail data pattern. However, these 18 bits can be compressed by adding to Literal Code ("LCode") bits to the NLIT event. The LCode bits designate the NLIT "Payload," i.e., the number of bits in the fail data pattern that should be stored in the dictionary. The value of the LCode bits correspond to the number of fail data bits, i.e. "1" at the tested memory address. For a 16-bit memory array, an LCode of "00" designates a Payload of 4 bits, which would be used for a single bit fail. As a result, rather than requiring 18 bits, a NLIT event would require only 8 bits, i.e., 2 ECode bits, 2 LCode bits, and 4 Payload bits. An LCode of "01" designates a Payload of 8 bits and further designates these 8 bits as being the least significant 8 bits. An LCode of "10" designates a Payload of 8 bits and further designates these 8 bits as being the most significant 8 bits. Therefore, for an NLIT event having an Lcode of either "01" or "10," would require 12 bits, i.e., 2 ECode bits, 2 LCode bits, and 8 Payload bits. Finally, an LCode of "11" designates a Payload of the full 16 bits. An NLIT event having an Lcode of "11" would therefore require 20 bits, i.e., 2 ECode bits, 2 LCode bits, and 16 Payload bits. Thus, an NLIT event having an LCode of "11" actually expands the NLIT event from 18 bits to 20 bits. However, the compression of NLIT events as described above normally results in significant data compression because of the presence of single bit data fails and 8-bit data fail patterns.

The fail data compressor 60 used in the test system 10 of FIG. 1 will now be explained in greater detail with reference to FIG. 4. As explained above, data entering the fail data compressor 60 represents the bit-fail pattern from a single read operation of the memory device 12 (FIG. 1). This literal fail data is presented to a literal content addressable memory ("LitCAM") 100 and to a literal generator 104 in parallel. The literal generator 104 generator produces the ECode for NLIT events as well as the 4-bit index specifying the literal value of a bit of fail data and the repeat count specifying the number of times the fail data bit repeats. The LitCAM 100 uses a small, dynamic dictionary to reduce the 16-bit fail data to a 4-bit CAM address. When the fail data is not found in the LitCAM 100, a NewLitFlag is set and the new literal data is injected into the data stream at an advanced stage of the fail data compressor 60.

The 4-bit CAM address generated by the LitCAM 100 is routed to a run length compressor stage 108. In this stage 108, consecutive reads of like data are combined into a single "event." These events consist of the 2-bit ECode and the repeat count, which, as explained above, may be up to 24 bits in length. From the run length compressor stage 108, events are routed to a sequence detector 110. The sequence detector 110 monitors the stream of events looking for repeated sequences. The sequence detector 110 consists of three nearly identical sub-stages 112, 114, 116 each monitoring the data for a different length sequence. More specifically, the sub-stage 112 detects a sequence of 2 events, the sub-stage 114 detects a sequence of 3 events, and the sub-stage 116 detects a sequence of 4 events. When a repeated sequence is found, the repeated portion is removed and replaced with a single sequence event. A sequence event is similar to a run length event in that is uses a descriptor and a repeat count, as described above. All events entering one of the sub-stages 112, 114, 116 are treated the same regardless of their origin. In this way, the sequence detector 110 is able to compress compounded sequences (i.e., sequences of sequences of run length events).

When an event emerges from the sequence detector 110, it passes through a multiplexer 120 to a repeat count compressor 130 where unused nibbles are stripped from the repeated count portion of the event. Events with variable data widths are then packed into 32-bit words before being stored in a first-in, first-out ("FIFO") buffer 136 where they await their transfer to the host computer 30 (FIG. 1).

Figure 5:
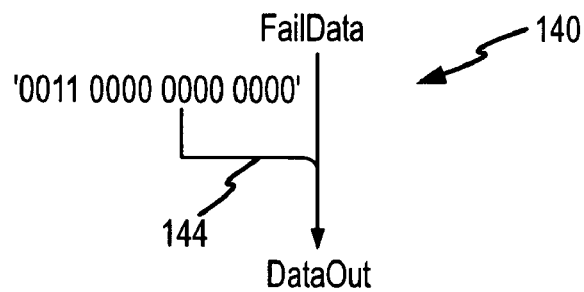
FIG. 5 is a block diagram illustrating one example of a literal generator that can be used in the fail data compressor of FIG. 4.

One example of a literal generator 140 that may be used as the literal generator 104 is shown in FIG. 5. The literal generator 140 is simply a wiring crossover 144 to justify the data bits and add the NLIT bit field, and to generate an NLIT event with an LCode of '11' as described above.

Figure 6:
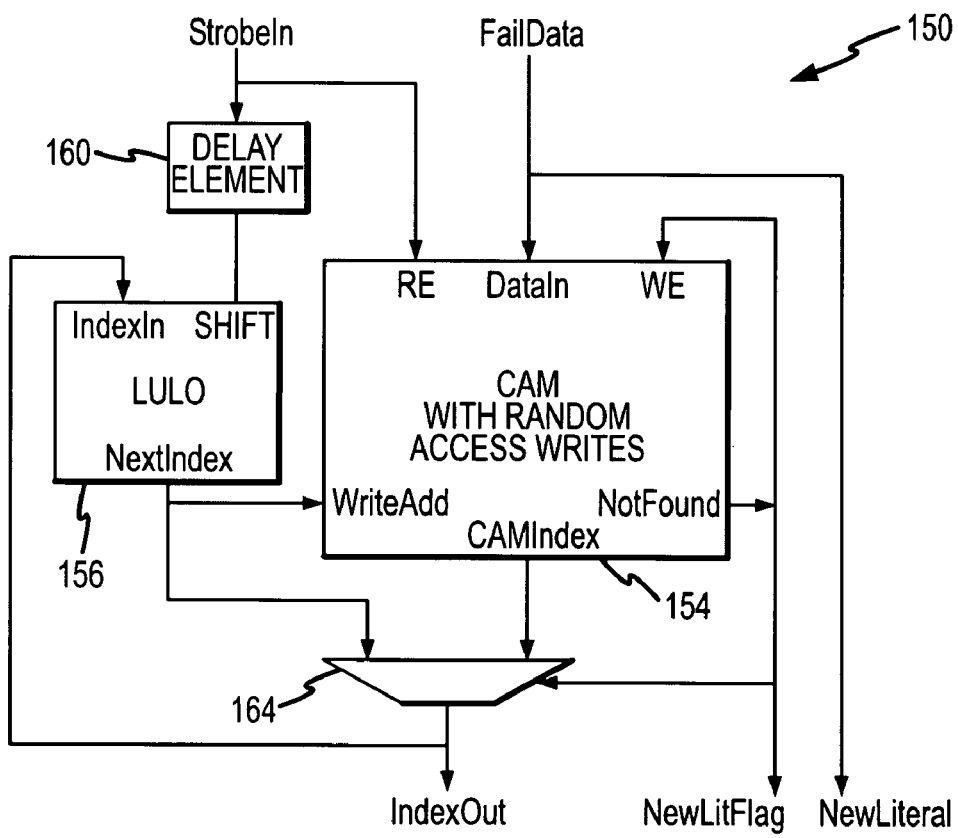
FIG. 6 is a block diagram illustrating one example of a literal content addressable memory that can be used in the fail data compressor of FIG. 4.

One example of a LitCAM 150 that may be used as the literal generator 100 is shown in FIG. 6. The LitCAM 150 includes a small content addressable memory ("CAM") 154 in conjunction with a last-used, last-out ("LULO") memory 156, a delay element 160 and a multiplexer 164. The CAM 154 is 16-bits wide (the width of the Literal Fail Data), 16 addresses deep, and includes a random access write port. It is initialized on reset with sixteen unique data words, as explained above. The inputs to the CAM 154 include read enable ("RE"), input data ("DataIn"), write enable ("WE")

and write address ("WriteAdd"). Outputs include memory index ("CAMIndex") and NotFound.

When Fail Data are presented to the CAM 154 at the DataIn port, internal comparators determine if and where the data is located in the CAM 154. CAM outputs are enabled when RE goes high. If the data is found, the CAM Index is coupled through the multiplexer 164 to an "IndexOut" port. If the data were not found, the NotFound signal is asserted, which is used to control the operation of the multiplexer 164. When fail data are NotFound in the CAM 154, the multiplexer 164 couples the output of the LULO memory 156 to the IndexOut port. When NotFound is false (i.e., fail data were found in the CAM 154) the multiplexer 164 couples the CAMIndex port of the CAM 154 to the IndexOut port. The NotFound signal also feeds back to the WE input to the CAM 154. When WE is high, data on the DataIn port is written to the CAM address presented on the WriteAdd port. The WriteAdd port of the CAM 154 is driven by the LULO memory 156. In this way, the LULO memory 156 provides the same value to the WriteAdd port of the CAM 154 and to the IndexOut port for use by external circuitry (not shown). This makes IndexOut valid one clock cycle after DataStrobe goes high regardless of whether or not the fail data were found in the CAM 154. The NotFound signal is also exported from the LitCAM 150 and used as the "NewLitFlag", which indicates to other parts of the fail data compressor 60, that a New Literal (new fail data) was found.

Figure 7:
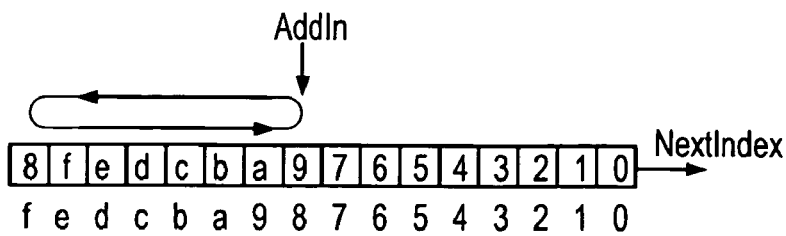
FIG. 7 is a schematic diagram illustrating one example of the operation of the literal content addressable memory of FIG. 6.

Whenever fail data are presented to the CAM 154 but are not found in the CAM 154, a CAM address must be overwritten with the new data. The new data must also be included in the data stream since they comprise information necessary for offline de-compression. However, including these data reduces the effective compression ration and therefore should be mitigated. To reduce the frequency at which data must overwrite data stored in the CAM 154, it is preferable to keep the most recently matched fail data in the CAM 154, and overwrite the fail data that hasn't been matched at all, or the one that hasn't matched for the longest time. The LULO memory 156 is therefore used to select the next address of the CAM 154 that will be overwritten with new fail data. Inputs include IndexIn and Shift. Outputs include NextIndex. The memory is 4-bits wide and 16 addresses deep. On reset, the LULO memory 156 is initialized linearly so that the value stored at each address is equal to its address. When the Shift signal is asserted, a portion of the LULO memory 156 is rotated. FIG. 7 schematically illustrates an operation in which AddIn is equal to 8. The data between address 0xf and address 8 (inclusive) are rotated one location. This moves the data that was at address 8, to address 0xf, and shifts the other data down one position (closer to location 0x0). The output of the LULO memory 156 is always the value at location 0x0.

Figure 8:
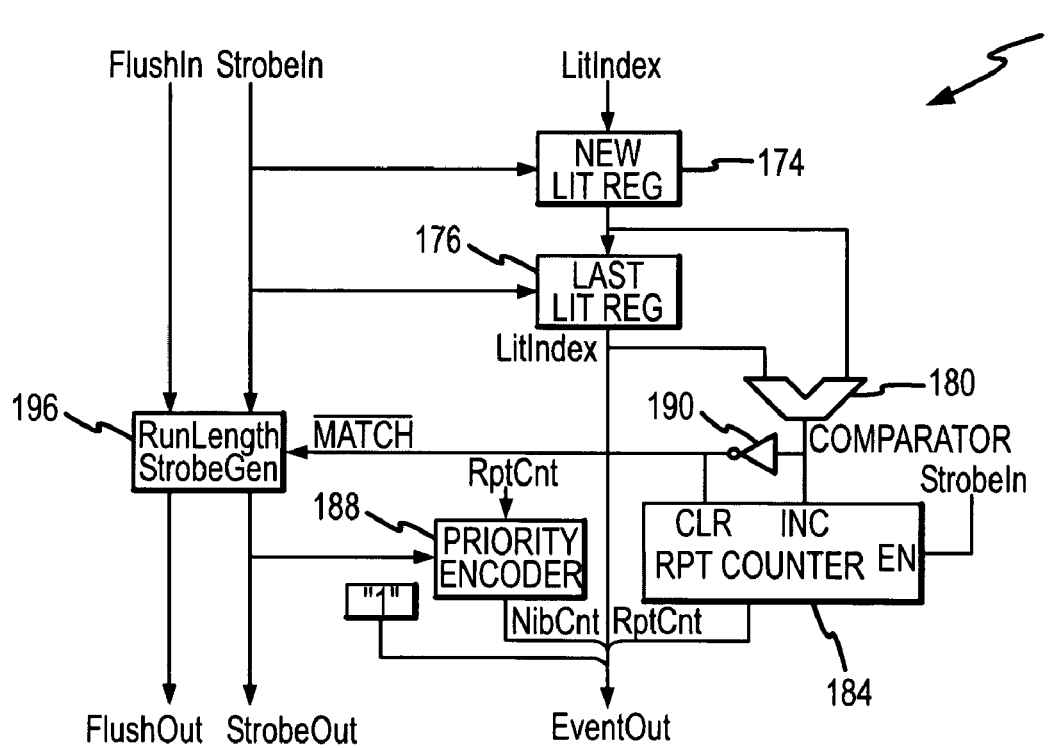
FIG. 8 is a block diagram illustrating one example of a run length compressor stage that can be used in the fail data compressor of FIG. 4.

One example of a run-length compressor stage 170 that may be used as the run-length compressor stage 108 (FIG. 4) is shown in FIG. 8. The run-length compressor stage 170 includes a NewLit register 174 into which a 4-bit LitIndex is latched when a StrobeIn signal is toggled. The next time the StrobeIn signal is toggled, the data stored in the NewLit register 174 is transferred to a LastLit register 176. The contents of NewLit register 174 and LastLit register 176 are compared by a comparator 180, and, when they are equal, a repeat counter ("RptCounter") 184 is incremented. The repeat counter 184 is used with a priority encoder 188 to generate a nibble count ("NibCnt"), which is simply a count of the number of nibbles in the repeat count that contain information. For example, the number 0x000123 needs only three nibbles to represent the value. In this case, the priority encoder 188 would generate a NibCnt of 3. When the content of the NewLit register 174 does not match the content of the LastLit register 176, the repeat counter 184 is cleared through an inverter 190. RunLength events are constructed from four bit fields which, as explained above, include the Ecode, the nibble count, the contents of the LastLit register 176 and the contents of the RptCounter 184.

The run-length compressor stage 170 also includes a run length strobe generator 196, which generates a FlushOut signal that is used to inform the fail data compressor 60 that the read of the memory device 12 (FIG. 1) is complete and the fail data compressor 60 is being flushed to retrieve the compressed data stored therein to make a complete fail bit map. This signal propagates through each stage of the fail data compressor 60 and is referred to as FlushI/FlushOut relative to the given stage. Likewise, a Strobe signal propagates through each stage of the fail data compressor 60 and is referred to as StrobeIn/StrobeOut in any given stage. The run length compressor stage 170 processes the Flush and Strobe signals in the run length strobe generator 196.

Figure 9:
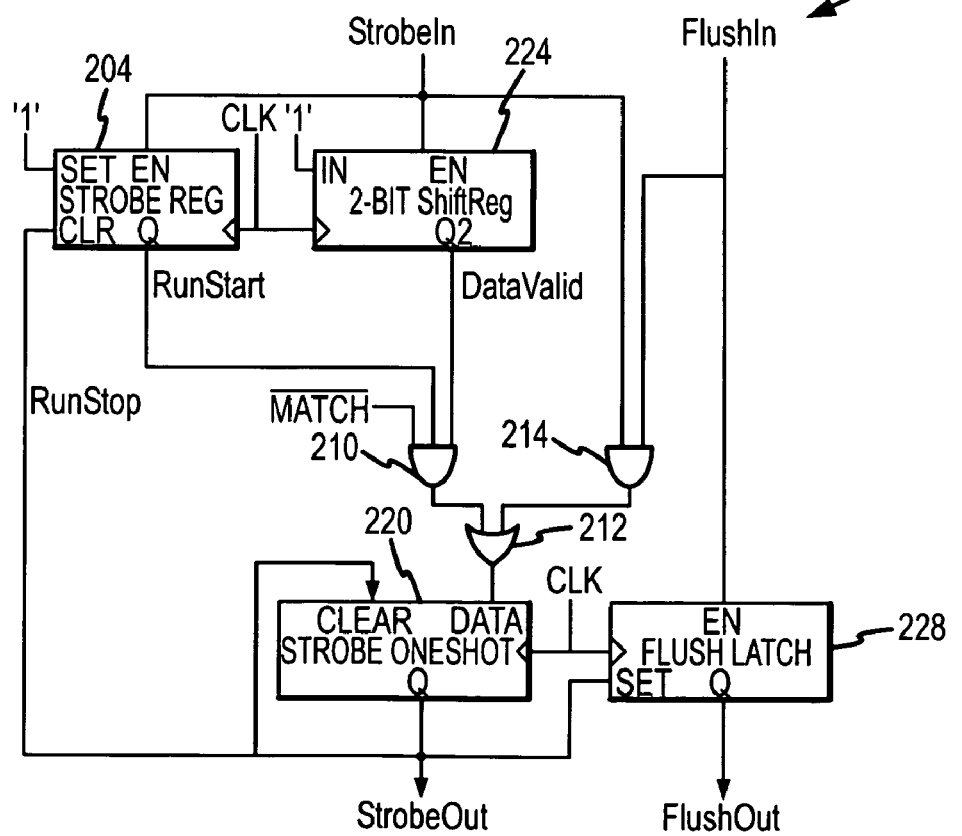
FIG. 9 is a block diagram illustrating one example of a run length compressor stage that can be used in the fail data compressor of FIG. 4.

An example of a run length strobe generator 200 that can be used as the run length strobe generator 196 is shown in FIG. 9. The FlushOut signal is activated when the FlushIn signal goes high followed by a StrobeOut Signal. This insures that any data in the repeat counter 184 of the run length compressor stage 170 is allowed to transfer out of this stage 170 before the FlushOut signal is asserted. The StrobeOut signal is asserted every time a RunLength event is terminated. A RunLength event describes a series of memory reads in which the fail data does not change. The RunLength event begins when the StrobeIn signal goes high enabling a strobe register 204 to be set. The strobe register 204 will remain set until it is cleared by a RunStop signal, which is asserted at the end of a RunLength event. In response to the start of a RunLength event, the strobe register 204 outputs a RunStart signal that enables an AND gate 210. Thereafter, the low Match signal from the inverter 190 (FIG. 8) is coupled through the AND gate 210 and through an OR gate 212 to cause a StrobeOneshot register 220 to produce a single pulse StrobeOut signal (one clock cycle in duration). Thus, a single pulse StrobeOut signal is produced responsive to the Match signal going low after the start of a RunLength event.

At the beginning of every read of the memory device 12, the first two Strobe pulses are invalid since the NewLit register 174 and LastLit Register 176 do not contain valid data. A 2-bit shift register 224 is used to disable the Strobe Oneshot 220 until this condition is satisfied. Once satisfied, the Data-Valid signal remains high until the fail data compressor 60 is reset, setting things up for the next memory device read. While the FlushIn signal is high, StrobeIn pulses are coupled through an AND gate 214 and the OR gate 212 to generate the StrobeOut pulses. This allows downstream stages to flush properly. The run length strobe generator 200 also includes a flush latch 228, which generates the FlushOut signal responsive to the FlushIn signals in synchronism with a clock signal. As explained above, the FlushOut signal informs the fail data compressor 60 that the read of the memory device 12 (FIG. 1) is complete and the fail data compressor 60 is being flushed to retrieve the compressed data stored therein to make a complete fail bit map.

Figure 4:
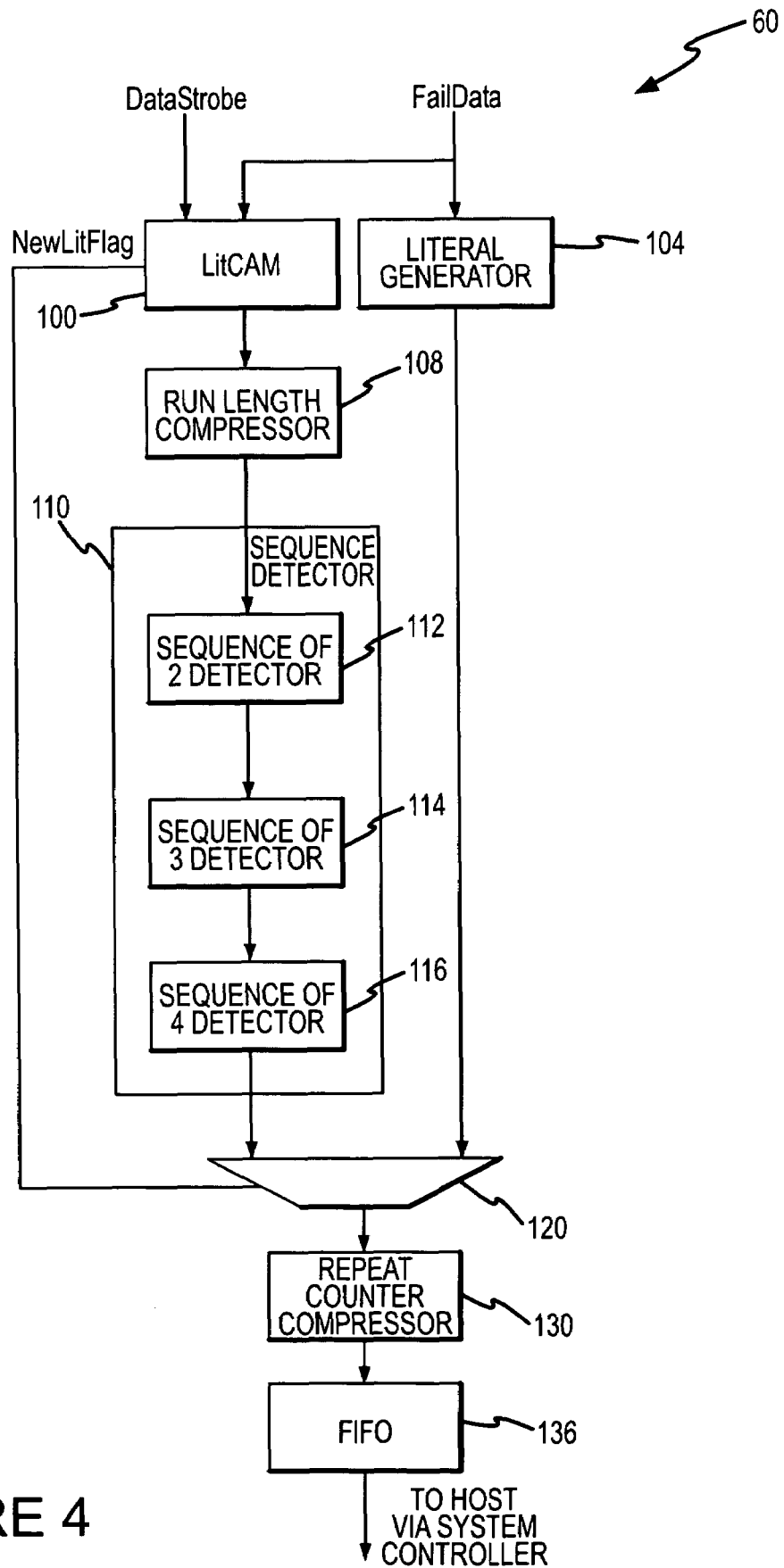
FIG. 4 is a block diagram illustrating one example of a fail data compressor that can be used in the testing system of FIG. 1.
Figure 10:
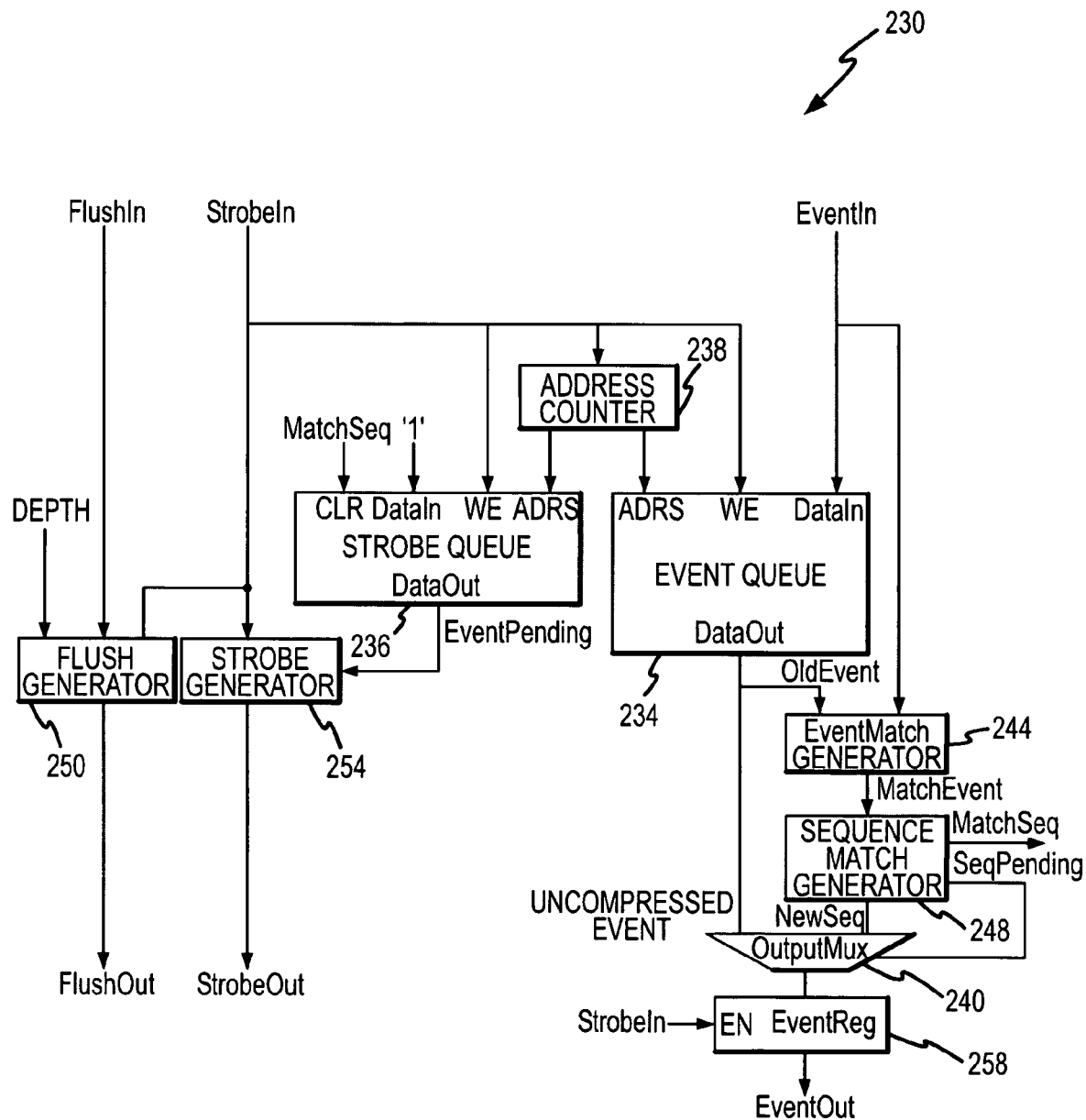
FIG. 10 is a block diagram illustrating one example of a sequence of depth detector that can be used in the fail data compressor of FIG. 4.

The sequence detector 110 as shown in FIG. 4 is composed of several nearly identical sequence detectors 112, 114, 116, each of which detects a repeating sequence of a given length, referred hereafter as its "depth." One example of a sequence of depth detector 230 that can be used as any of the sequence detectors 112, 114, 116 is shown in FIG. 10. The sequence of depth detector 230 includes an event queue 234, a strobe queue 236, an address counter 238 an output multiplexer 240 and several logic blocks that will be explained in greater detail below. The event queue 234 is a memory with one input port and one output port. The event queue 234 is 2*DEPTH addresses deep. Data is written to the memory through the DataIn port at the address asserted on Adrs input.

The DataOut Port of the event queue 234 is also addressed by the value on Adrs, but is offset by an internal depth addresses DEPTH. That is, if the input is written to the event queue 234 at location N, then the data stored in the event queue 234 at location N+DEPTH is output from the event queue 234. If N is greater than the depth value, then N+DEPTH is greater than the memory depth of 2*DEPTH, causing the output address to wrap back to the N−DEPTH. Therefore, the output of the event queue 234 always corresponds to an event that was received DEPTH events ago.

The Adrs provided to the event queue 234 is generated by the address counter 238, which increments each time the StrobeIn signal is toggled. When the count reaches 2N−1 it wraps back to 0 on the next StrobeIn signal. Each time the StrobeIn signal is toggled, the EventIn data presented on the DataIn port is written to the event queue 234.

The OldEvent data at the output of the event queue 234 along with the EventIn currently being processed are presented to an event match generator 244. When a match occurs, the event match generator 244 asserts an MatchEvent signal indicating that the event currently being processed matches the event that was received DEPTH events ago.

The sequence of depth detector 230 also includes a sequence match generator 248 that keeps track of the number of consecutive matching events that occur and generates a new sequence event ("NewSeq") signal to describe the sequence. The sequence match generator 248 also keeps track of the number of times the sequence repeats.

The Output multiplexer 240 switches the output between the output of the event queue 234 and the sequence match generator 248 responsive to a SeqPending signal from the sequence match generator 248. As a result, the EventOut signal is registered for use by the downstream module.

The strobe queue 236 is similar to the event queue 234 in that it is a memory with 2*DEPTH addresses, one input port and one output port and it's output port is offset by DEPTH from the input port. The strobe queue 236 is addressed by the same address counter 238 that addresses the event queue 234, and data are written to the strobe queue 236 responsive to each StrobeIn pulse. However, instead of a 16-bit data word, the strobe queue 236 is only 1-bit wide and includes a Clear input, which clears the memory contents to zero when asserted. Also, a logic "1" is always applied to the DataIn input.

The strobe queue 236 operates in parallel with the event queue 234 and is used to keep track of events that need to be transferred to the next stage. If the output address is at address N, and a "1" is stored at address N in the strobe queue 236, the event stored at address N in the event queue 234 is pending and will be transferred to the output of the Sequence of DEPTH Detector 230.

When the sequence match generator 248 detects a sequence or a repeated sequence, it asserts the MatchSeq signal which clears all pending events in the strobe queue 236.

Figure 11:
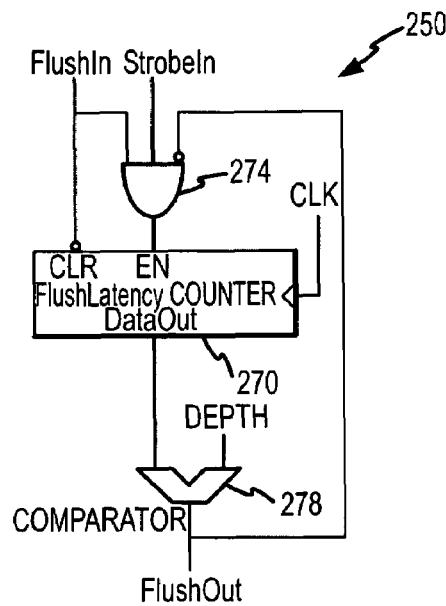
FIG. 11 is a block diagram illustrating one example of a flush generator that can be used in the sequence of depth detector of FIG. 10.

The sequence of depth detector 230 also includes a flush generator 250, a strobe generator 254 and an event register 258, all of which will be explained in greater detail below. As shown in FIG. 11, the flush generator 250 includes a flush latency counter 270 having an enable input coupled to the output of an AND gate 274. The flush latency counter 270 is set to zero on reset responsive to the FlushIn signal being deasserted. Once the FlushIn signal is asserted to enable the AND gate 274, the flush latency counter 270 counts DEPTH StrobeIn pulses. A comparator 278 compares the output of the counter 270 to the DEPTH value, and asserts the FlushOut signal when the output of the counter 270 reaches the DEPTH value. The asserted FlushOut signal disables the AND gate 274 to disable the counter 270 from incrementing further.

Figure 12:
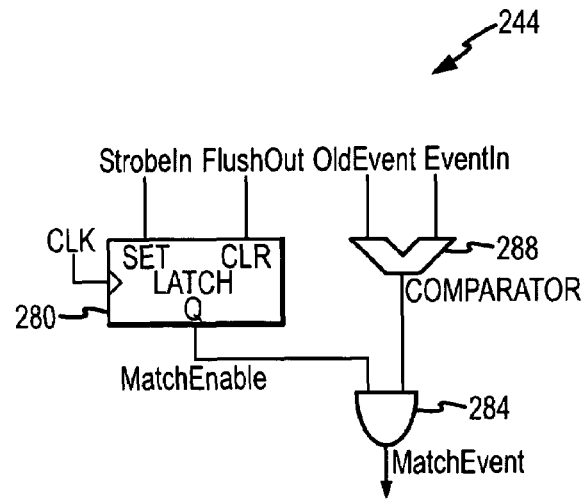
FIG. 12 is a block diagram illustrating one example of an event match generator that can be used in the sequence of depth detector of FIG. 10.

One example of the event match generator 244 is shown in FIG. 12. The event match generator 244 includes a latch 280 that is set responsive to the StrobeIn signal and cleared responsive to the FlushOut signal. When set, the latch 280 asserts a MatchEnable signal that enables an AND gate 284. The AND gate 284 then generates a MatchEvent signal corresponding to the output of a comparator 288, which compares OldEvent data to EventIn data. The EventMatch signal is asserted when the OldEvent and EventIn data are equal. Insofar as the latch 280 is set by the StrobeIn signal, the MatchEvent signal is not enabled until at least one StrobeIn signal is detected.

Figure 13:
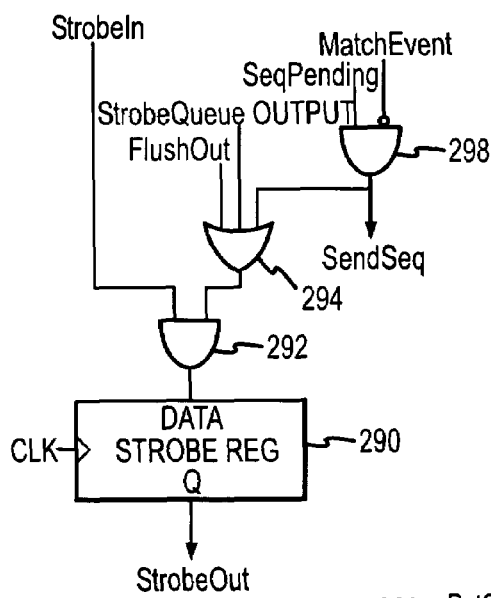
FIG. 13 is a block diagram illustrating one example of a strobe generator that can be used in the sequence of depth detector of FIG. 10.

One example of the strobe generator 254 used in the sequence of depth detector 230 is shown in FIG. 13. The strobe generator 254 includes a strobe register 290 having a data input coupled to the output of an AND gate 292 that receives the StrobeIn signal and an output from an OR gate 294. The OR gate 294 has first and second inputs receiving the FlushOut signal and Strobe Queue Output signal, respectively, and a third input coupled to the output of an AND gate 298. The AND gate 298 has a first input receiving the SeqPending signal and an inventing input receiving the MatchEvent signal. When the AND gate 292 is enabled, the StrobeOut signal is simply the StrobeIn signal delayed by one clock cycle. There are three conditions in which the AND gate 292 is enabled. The first is when the StrobeQueueOutput flag is set. This indicates that an event at the output of the Event Queue was not part of a sequence and needs to be transmitted as it. The second condition in which the AND gate 292 is enabled is when the FlushOut signal is asserted. In this case, the sequence of depth detector 230 has already been flushed and the Strobe signal is passed along to the next stage. Lastly, a StrobeOut pulse is generated when there is a sequence pending and the MatchEvent flag is false. This occurs when a sequence has been detected but has not yet been sent, and the EventIn data does not follow the sequence pattern. In this case the Sequence Event is forwarded to the next stage.

Figure 14:
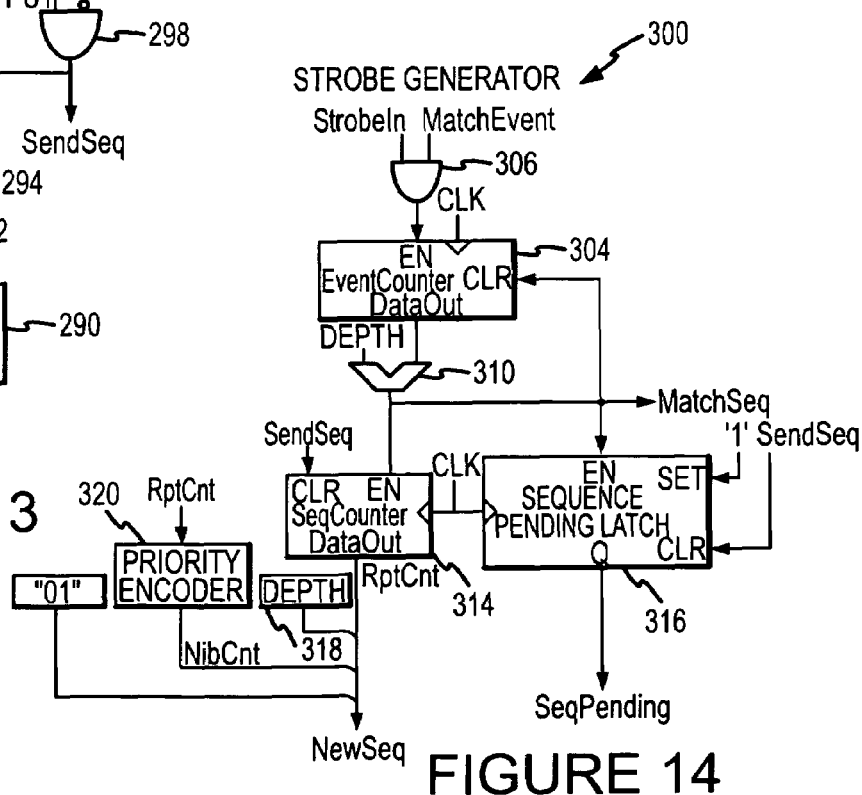
FIG. 14 is a block diagram illustrating one example of a sequence match generator that can be used in the sequence of depth detector of FIG. 10.

One example of a sequence match generator 300 that may be used as the sequence match generator 248 in the sequence of depth detector 230 (FIG. 10) is shown in FIG. 14. The sequence match generator 300 includes an event counter 304 that is incremented by clock pulses whenever it is enabled by a high at the output of an AND gate 306. The AND gate 306 is enabled when the StrobeIn signal is asserted so that MatchEvent pulses are coupled through the AND gate 306 to increment the counter 304. A comparator 310 compares the number of matching events counted by the counter 304 to the DEPTH value. When the comparator 310 detects that the number of matching events counted by the counter 304 equals the DEPTH value output by the DEPTH Detector, a Match-Seq signal is asserted.

A sequence counter 314 is enabled in response to the MatchSeq signal, thereby allowing a clock signal to increment the sequence counter 314. The sequence counter 314 outputs repeat count ("RptCnt") data indicative of the number of times the sequence of events counted by the event counter 304 was detected. A sequence pending latch 316 also outputs a high SeqPending signal responsive to the clock signal after the latch 316 is enabled by the MatchSeq signal. The Match-Seq signal also clears the event counter 304 to allow the events in the next sequence to be counted. The sequence pending latch 316 and sequence counter 314 are not cleared until the SendSeq signal is received indicating that sequence event has been delivered to the next stage. The sequence event is composed of the NSEQ Ecode, the DEPTH value stored in a depth register 318 and the contents of the sequence counter 314, i.e., the repeat count. The repeat count is converted into a nibble count ("NibCnt") by a priority encoder 320 and is output as part of the sequence event.

Figure 15:
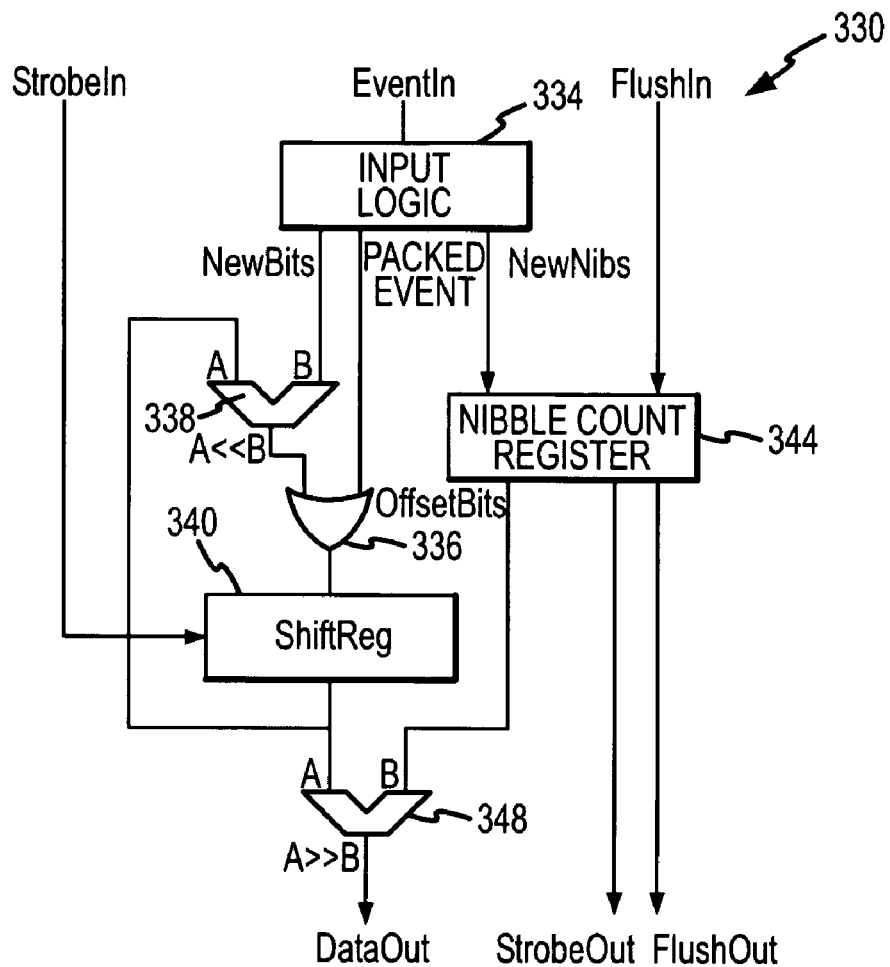
FIG. 15 is a block diagram illustrating one example of a repeat count compressor that can be used in the fail data compressor 60 of FIG. 4.

One example of a repeat count compressor 330 that may be used as the repeat count compressor 130 in the fail data compressor 60 (FIG. 4) is shown in FIG. 15. The repeat count compressor 330 includes input logic 334 that removes unused nibbles from the repeat count portion of each event and the resulting packed event is serialized. The serialized bits are then divided into 32-bit words before being delivered to the next stage (the FIFO).

For example, a RunLength Event that describes a series of 5 consecutive identical memory read results whose LitIndex is 15, would appear to the input logic 334 as follows:

10 01 1111 0000 0000 0000 0000 0000 0101

Unused Nibbles

Because the nibble count ("NibCnt") is "1", we know that this event includes 5 unused Nibbles in the repeat count ("RptCnt"). The input logic 334 removes these unused nibbles and the resulting "packed event" output from the input logic 334 would be as follows:

xxxx xxxx xxxx xxxx xxxx 10 01 1111 0101

The NewNibs output from the input logic 334 reflects the number of nibbles that are needed to represent the packed event. In this case NewNibs would equal 3. The BitCnt output from the input logic 334 is simply the number of bits needed to represent the packed event (in this case 12).

Packed event data are coupled through OR gates 336 when the gates 336 are enabled by an A<<B signal from a comparator 338. The packed event data are then serialized in a shift register 340 and output in 32-bit words. When the StrobeIn signal is received, any packed event data stored in the shift register 340 are shifted left (more significant) by BitCnt bits and the newly packed event is added to the right (least significant) end of the shift register 340.

A nibble count register 344 keeps track of the number of valid nibbles that are stored in the shift register 340. The OffsetBits signal generated by the nibble count register 344 is equal to the number of valid bits (nibbles*4) stored in the shift register 340 and adjusted by a value of 32. To continue with the example provided above, with three valid nibbles stored in the shift register 340, OffsetBits would equal:

(3nibbles−8nibbles)*4bit/nibble=−20bits.

The OffsetBits signal is then used to select the appropriate bit field for the output.

During operation, the shift register 340 accumulates data until it contains more than 31 bits of valid data. Once more than 31 bits of valid data have been received, the nibble count register 344 generates the StrobeOut signal and recalculates a new value for the OffsetBits data. When a comparator 348 detects that the value of the OffsetBits data is less than zero, this indicates that the shift register 340 contains less than 32 bits of valid data. In this case, the valid data field is left justified in the DataOut bus and the StrobeOut signal will not toggle unless the stage is in the flush mode.

Figure 16:
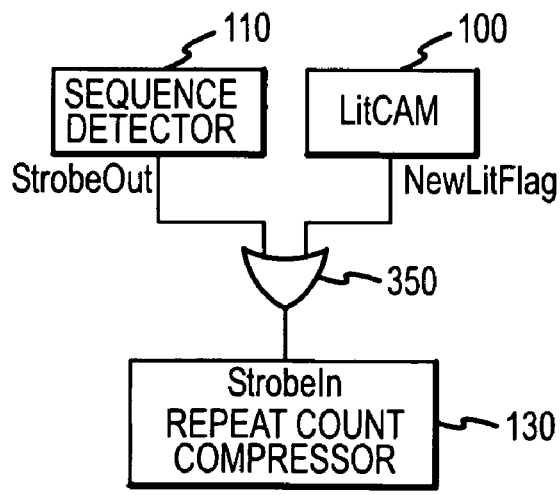
FIG. 16 is a block diagram showing one example of circuitry for combining signals in the fail data compressor 60 of FIG. 4.

FIG. 16 shows one example of a technique for combining the NewLit Flag generated by the LitCAM 100 (FIG. 4) and the StrobeOut signal generated by the sequence detector 110 (FIG. 4) and coupled through the multiplexer 120. Both the StrobeOut signal and the NewLitFlag can be coupled through an OR gate 350, and its output can be applied to the StrobeIn input of the repeat count compressor 130 (FIG. 4). By ORing the NewLitFlag into the StrobeIn line, and multiplexing the NewLiteral data into the repeat count compressor 130, the new literal event is injected into the data stream as if it were a run length or sequence event.

Figure 17:
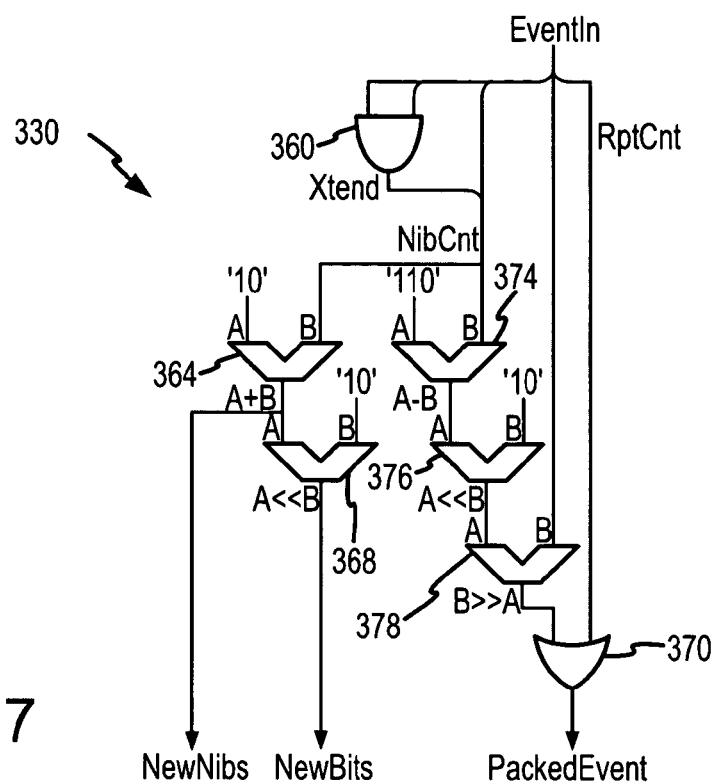
FIG. 17 is a block diagram illustrating one example of input logic that can be used in the repeat count compressor of FIG. 15.

One example of the input logic 334 (FIG. 15) is shown in FIG. 17. The input logic 334 consists of an array of arithmetic units to rearrange and analyze the incoming events. An AND gate 360 is used to decode the ECode. If the incoming event has an ECode of "11" designating an XLIT, an adder 364 increases the nibble count ("NibCnt") by 4 for reasons that have been explained above. The value of the NewNibs data represents the number of valid nibbles in the PackedEvent data. A comparator 368 generates NewBits data, which represents the number of valid bits in the PackedEvent data.

The PackedEvent data generated at the output of OR gates 370 describes a packed event, which is equivalent to the incoming event with the unused repeat count nibbles stripped away as previously explained. It is generated by an adder 374 and a series of comparators 376, 378.

Figure 18:
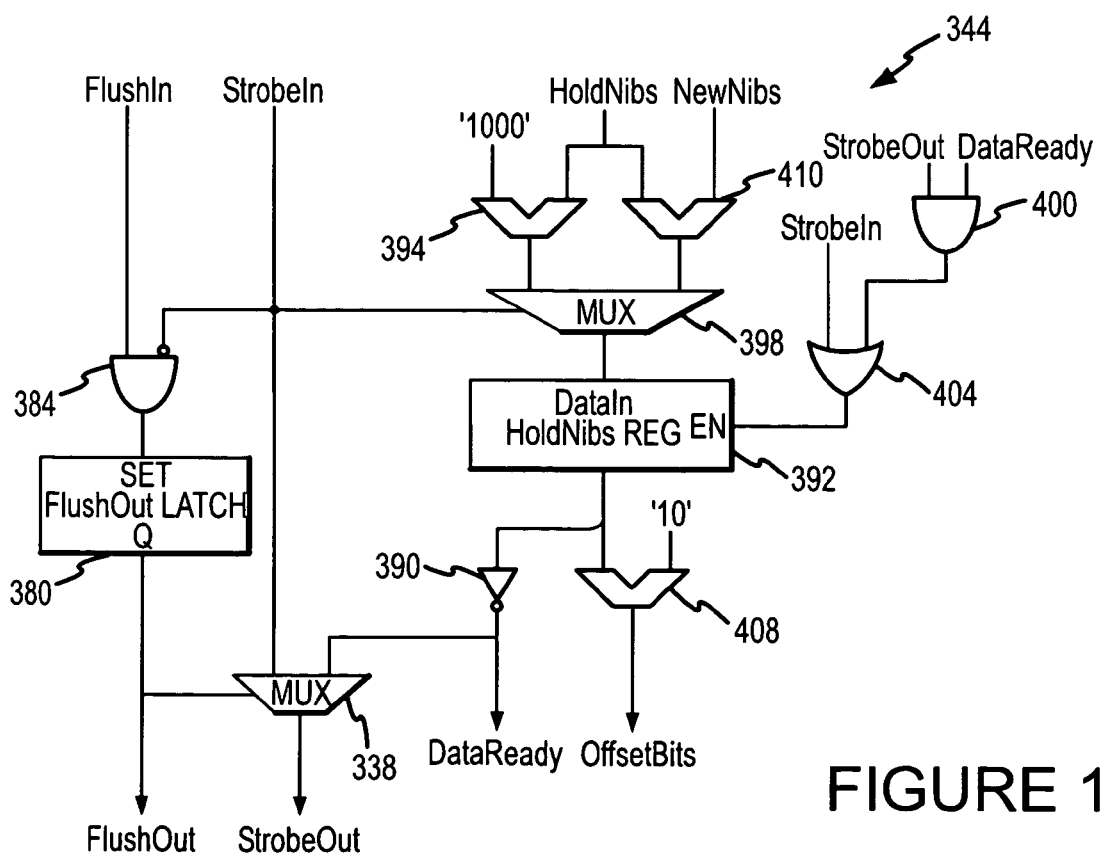
FIG. 18 is a block diagram illustrating one example of a nibble count register that can be used in the repeat count compressor of FIG. 15.

One example of the nibble count register 344 (FIG. 15) is shown in FIG. 18. As explained above, the nibble count register 344 keeps track of the number of valid nibbles that are stored in the shift register 340 (FIG. 15), but it also generates the StrobeOut and FlushOut signals for this stage. The FlushOut signal is generated by a flush out latch 380 being set, which occurs responsive to the StrobeIn signal is deasserted after an AND gate 384 has been enabled by the FlushIn signal. When the stage is in flush mode by the FlushOut signal being asserted, a multiplexer 388 routes the StrobeIn signal directly to StrobeOut. However, during normal operation, the multiplexer 388 routes the DataReady signal output by an inverter 390 to StrobeOut.

The nibble count register 344 also includes a nibble hold register 392, which functions to store a value equal to the number of currently valid nibbles contained in the shift register 340. This register 392 is initialized on reset with a value of '1000' (decimal −8), which is generated by an adder 394 and coupled through a multiplexer 398. The multiplexer 398 can alternatively couple the output of an adder 410 to the DataIn input to the nibble hold register 392. When the StrobeIn signal is asserted, a packed event is added to the 340 as explained above so the nibble hold register 392 is reloaded with the value currently stored in the nibble hold register plus the number of new nibbles being added to the shift register 340. When the StrobeOut signal is generated, it is coupled through an AND gate 400 if the DataReady signal is asserted and then through an OR gate 404 to the enable input of the nibble hold register 392. The StrobeOut signal coupled to the enable input causes the nibble hold register 392 to be reloaded with the value currently stored in the nibble hold register 392 minus 8. The 8 nibbles (32 bits) in the shift register 340 to delivered to the next stage. Any time the number of nibbles in the nibble hold register 392 goes positive (i.e., the HoldNibs [4] data goes to zero), the DataReady signal is asserted. This causes the upper 8 nibbles of valid data in the Shift Register 340 to be transferred to the next stage.

A comparator 408 generates an OffsetBits value that is used to track the most significant bit in the shift register 340. This value is relative to the center of the shift register 340. For example, when the value of OffsetBits equals 0, the first valid bit in the shift register 340 is at bit 31.

From the foregoing it will be appreciated that, although specific embodiments of the invention have been described herein for purposes of illustration, it will be understood by one skilled in the art that various modifications may be made without deviating from the spirit and scope of the invention. Accordingly, the invention is not limited except as by the appended claims.

What is claimed is:

1. A testing system, comprising:
a signal generator operable to initially generate and output from the testing system sets of memory write command signals and sets of address signals and to output from the testing system respective sets of write data signals along with each of the sets of the memory write command signals, the signal generator further being operable to subsequently generate and output from the testing system sets of memory read command signals and sets of the address signals;
a comparator coupled to the signal generator, the comparator being operable to receive each set of read data signals received by the testing system responsive to each set of the memory read command signals, the comparator being operable to compare each set of received read data signals to a corresponding set of the write data signals, the comparator being operable to output fail data signals having a first value responsive to the received set of read data signals matching the corresponding set of write data signals and having a second value responsive to the received set of read data signals not matching the corresponding set of write data signals; and
a lossless fail data compressor coupled to the comparator, the fail data compressor being operable to generate from the fail data signals compressed fail data comprising at least one record of a first type containing an indication of the number of consecutive sets of address signals for which respective fail data signals have the same value, the compressed fail data further comprising at least one record of a second type containing an indication of the number of times that a sequence of records of the first type are repeated.

2. The testing system of claim 1 wherein the at least one record of the second type contains an indication of a number of bits used to provide the indication of the number of times that a sequence of records of the first type are repeated.

3. The testing system of claim 1 wherein the at least one record of the first type contains an indication of a number of bits used to provide the indication of the number of consecutive fail data signals having the same value.

4. The testing system of claim 1 wherein the at least one record further contains an indication of whether the consecutively repeated fail data signals have the first value or the second value.

5. The testing system of claim 1 wherein a respective fail data signal is provided for each of the read data signals in each set, and wherein the at least one record of the first type contains an indication of whether each of the fail data signals provided for each of the read data signals in each set have the first value or the second value.

6. The testing system of claim 5, further comprising a fail data pattern memory containing at respective addresses a plurality of patterns of fail data values, and wherein the indication of whether each of the fail data signals provided for each of the read data signals in each set have the first value or the second value comprises the address at which is stored the pattern of fail data values corresponding to the fail data signals provided for each of the read data signals in each set.

7. The testing system of claim 6 wherein the fail data compressor is operable to determine if the pattern of fail data values corresponding to the fail data signals provided for one of the sets of read data signals is stored in the fail data pattern memory, and, if the determination is made that the pattern of fail data values is not stored in the fail data pattern memory, to write the pattern of fail data values corresponding to the fail data signals provided for the set of read data signals into the fail data pattern memory at a respective address and to insert in the record of the first type the respective address as the indication of whether each of the fail data signals provided for each of the read data signals in each set have the first value or the second value.

8. The testing system of claim 6 wherein the fail data pattern memory comprises a content addressable memory device.

9. The testing system of claim 8 wherein the content addressable memory device is addressed using the pattern of fail data signals provided for each set of the read data signals.

10. The testing system of claim 1 wherein the comparator comprises a set of exclusive OR gates, one of which is provided for each of the read data signals in a set.

11. The testing system of claim 1 wherein the write command signals, read command signals and addresses provided by the signal generator comprises dynamic random access memory or NAND flash write command signals, read command signals and addresses.

12. The testing system of claim 1, further comprising a host computer coupled to the fail data compressor, the fail data compressor being operable to transfer to the host computer the compressed fail data in real time.

13. The testing system of claim 12, further comprising a system controller coupled to the fail data compressor and the host computer, the compressed fail data being transferred from the fail data compressor to the host computer through the system controller.

14. A method of testing a memory device, comprising:
transmitting to the memory device sets of memory write command signals;
transmitting to the memory device a set of address signals contemporaneously with each of the transmitted sets of write command signals;
transmitting to the memory device a set of write data signals contemporaneously with each of the transmitted sets of write command signals;
after a plurality of sets of write command signals have been transmitted to the memory device, transmitting to the memory device sets of memory read command signals;
transmitting to the memory device a set of address signals contemporaneously with each of the transmitted sets of read command signals;
receiving sets of read data signals responsive to respective sets of read command signals and respective sets of contemporaneously transmitted address signals;
comparing each set of received read data signals to a corresponding set of the write data signals;
providing a fail data signal having a first value responsive to the received set of read data signals matching the corresponding set of write data signals;
providing a fail data signal having a second value responsive to the received set of read data signals not matching the corresponding set of write data signals; and
generating compressed fail data indicative of the values of the provided fail data signals, the compressed fail data being generated in a lossless manner by generating at least one record of a first type containing an indication of the number of consecutive fail data signals having the same value, generating at least one record of a second type containing an indication of the number of times that a sequence of records of the first type are repeated, and including in each record of the second type an indication of a number of bits used to provide the indication of the number of times that a sequence of records of the first type are repeated.

15. The method of claim 14 wherein the act of generating at least one record of a first type further comprises including in each record of the first type an indication of a number of bits used to provide the indication of the number of consecutive fail data signals having the same value.

16. The method of claim 14 wherein the act of generating at least one record of a first type further comprises including in each record of the first type an indication of whether the consecutive fail data signals having the same value have the first value or the second value.

17. The method of claim 16 wherein a respective fail data signal is provided for each read data signal in each of the received sets of read data signals that does not match a corresponding write data signal in the corresponding set of write data signals.

18. The method of claim 17 further comprising storing in a device other than the memory device at respective addresses a plurality of patterns of fail data signals, and wherein the act of including in each record of the first type the indication of whether the consecutive fail data signals having the same value have the first value or the second value comprises:
   determining if each provided set of fail data signals matches one of the stored plurality of patterns of fail data signals; and
   if it is determined that the provided set of fail data signals matches one of the stored plurality of patterns of fail data signals, including in the record of the first type the address of the matching pattern of fail data signals.

19. The method of claim 18, further comprising:
   if it is determined that the provided set of fail data signals does not match one of the stored plurality of patterns of fail data signals,
   storing in a device other than the memory device at a respective addresses the provided set of fail data signals, and
   including in the record of the first type the address at which the provided set of fail data signals is stored.

20. The method of claim 18 wherein the act of determining if each of the provided sets of fail data signals matches one of the stored plurality of patterns of fail data signals comprises comparing the provided set of fail data signals to each of the stored plurality of patterns of fail data signals.

21. The method of claim 14 wherein a respective fail data signal is provided for each read data signal in each of the received sets of read data signals that do not match a corresponding write data signal in the corresponding set of write data signals.

22. The method of claim 14, further comprising transferring the compressed fail data to a host computer in real time.

23. A testing system, comprising:
   a signal generator operable to initially generate and output from the testing system sets of memory write command signals and sets of address signals and to output from the testing system respective sets of write data signals along with each of the sets of the memory write command signals, the signal generator further being operable to subsequently generate and output from the testing system sets of memory read command signals and sets of the address signals;
   a comparator coupled to the signal generator, the comparator being operable to receive each set of read data signals received by the testing system responsive to each set of the memory read command signals, the comparator being operable to compare each set of received read data signals to a corresponding set of the write data signals, the comparator being operable to output fail data signals having a first value responsive to the received set of read data signals matching the corresponding set of write data signals and having a second value responsive to the received set of read data signals not matching the corresponding set of write data signals, a respective fail data signal being provided for each of the read data signals in each set;
   a lossless fail data compressor coupled to the comparator, the fail data compressor being operable to generate from the fail data signals compressed fail data comprising at least one record of a first type containing an indication of the number of consecutive sets of address signals for which respective fail data signals have the same value and an indication of whether each of the fail data signals provided for each of the read data signals in each set have the first value or the second value; and
   a fail data pattern memory containing at respective addresses a plurality of patterns of fail data values, and wherein the indication of whether each of the fail data signals provided for each of the read data signals in each set have the first value or the second value comprises the address at which is stored the pattern of fail data values corresponding to the fail data signals provided for each of the read data signals in each set, the fail data compressor further being operable to determine if the pattern of fail data values corresponding to the fail data signals provided for one of the sets of read data signals is stored in the fail data pattern memory, and, if the determination is made that the pattern of fail data values is not stored in the fail data pattern memory, to write the pattern of fail data values corresponding to the fail data signals provided for the set of read data signals into the fail data pattern memory at a respective address and to insert in the record of the first type the respective address as the indication of whether each of the fail data signals provided for each of the read data signals in each set have the first value or the second value.

24. The testing system of claim 23 wherein the fail data pattern memory comprises a content addressable memory device.

25. The testing system of claim 24 wherein the content addressable memory device is addressed using the pattern of fail data signals provided for each set of the read data signals.

* * * * *

UNITED STATES PATENT AND TRADEMARK OFFICE
CERTIFICATE OF CORRECTION

PATENT NO.        : 7,596,729 B2                                              Page 1 of 1
APPLICATION NO.   : 11/479848
DATED             : September 29, 2009
INVENTOR(S)       : Matthew L. Adsitt It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 524 days.

Signed and Sealed this

Twenty-eighth Day of September, 2010

David J. Kappos
*Director of the United States Patent and Trademark Office*